(12) United States Patent
Hester et al.

(10) Patent No.: US 7,350,001 B1
(45) Date of Patent: Mar. 25, 2008

(54) METHOD AND APPARATUS FOR AUTOMATIC WORD LENGTH CONVERSION

(75) Inventors: Dylan Alexander Hester, Austin, TX (US); John Laurence Melanson, Austin, TX (US); Steven Green, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 1035 days.

(21) Appl. No.: 10/346,532

(22) Filed: Jan. 17, 2003

(51) Int. Cl.
*G06F 3/00* (2006.01)
*G06F 13/12* (2006.01)
*G06F 1/00* (2006.01)
*G06F 1/12* (2006.01)

(52) U.S. Cl. .................... 710/65; 710/58; 710/66; 710/69; 713/400; 713/500

(58) Field of Classification Search ............... None
See application file for complete search history.

(56) References Cited

U.S. PATENT DOCUMENTS

| | | | | |
|---|---|---|---|---|
| 4,691,294 A | * | 9/1987 | Humpleman | .............. 710/29 |
| 4,750,173 A | * | 6/1988 | Bluthgen | .............. 370/528 |
| 5,243,344 A | * | 9/1993 | Koulopoulos et al. | ...... 341/143 |
| 5,732,165 A | * | 3/1998 | Suzuki et al. | ............... 382/305 |
| 6,226,758 B1 | * | 5/2001 | Gaalaas et al. | ............. 713/600 |
| 6,920,540 B2 | * | 7/2005 | Hampel et al. | ............. 711/167 |
| 7,110,446 B1 | * | 9/2006 | Eccles et al. | ............... 375/226 |

* cited by examiner

*Primary Examiner*—Alan S. Chen
(74) *Attorney, Agent, or Firm*—James J. Murphy; Thompson & Knight LLP

(57) ABSTRACT

Methods and Apparatuses are provided for automatically converting a word length of sample data being transmitted over a serial link. A serial interface transmits and/or receives one or more data words comprising digital signals, a bit clock synchronizes transmission of individual bits, and a word clock is used to group the bits into sample words. A desired word length is determined based on the relationship between the bit clock and the word clock during the transmission or reception of a data word. Based on the desired word length, the sample data is either truncated or padded, and an appropriate amount of dither is added to the sample words to reduce the distortion and quantization artifacts introduced by the word length conversion.

12 Claims, 2 Drawing Sheets

METHOD AND APPARATUS FOR AUTOMATIC WORD LENGTH CONVERSION

FIELD OF INVENTION

The present invention relates in general to processing of sampled data, such as digital signal processing, and, in particular, to methods and apparatus for automatically converting the word length of data samples when transferring the data samples between devices or circuits.

BACKGROUND OF INVENTION

In typical digital processing applications, a digital signal is obtained that represents an analog signal. The digital signal is made up of a sequence of digital values, or samples, that represent the amplitude of the analog signal at regular intervals. The samples may be generated directly by a program or may be obtained by sampling an analog signal at regular intervals to produce a sequence of digital values. The digital signal may then be stored, modified, transmitted, or otherwise manipulated using digital techniques. The digital signal is then converted back into an analog signal.

As an example, an analog signal from a microphone is sampled to create a digital signal representative of a vocal track. The vocal track is then mixed with other sound tracks to create a song, which is then recorded onto an optical disk. During playback of the optical disk, a digital signal representing the recorded song is converted back into an analog signal and amplified to drive loudspeakers or headphones so that a user is able to hear the song.

Separate devices often perform the various processing steps described above. An analog-to-digital converter (ADC) converts the analog signal to a digital signal, a microprocessor or digital signal processor (DSP) processes the digital signal, and a digital-to-analog converter (DAC) converts the processed digital signal back into an analog signal. These devices often communicate among themselves using a serial interface to transfer the digital samples.

Converting sampled data from one word length to another is often desirable. In some instances, word length conversion is done to take advantage of hardware efficiencies that accrue when the data sample word length matches an intrinsic word length of a processor or other device. Many microprocessors and digital signal processors have native instructions for manipulating 8-bit or 16-bit data. Operating on data in native word sizes is more efficient than operating on non-native word sizes, since operating on non-native word sized data may require multiple instructions to perform the equivalent operation as a single instruction on native word sized data.

In other instances, word length conversion is done because a device is physically unable to process data of a given word size. For example, an ADC may be able to send 24-bit data words to a processor that is only able to receive 16-bit data words. Transmitting more bits than the hardware of the processor supports results in overflowing receive buffer of the processor and a loss of data.

One method of converting sampled data from one word size to another smaller word size is to simply truncate the larger data word to remove some of the low valued bits. However, truncation often results in undesirable distortion and quantization artifacts in the resulting digital signal. An improved method is to add a small amount of noise, also called dither, to the signal prior to truncation to reduce or minimize the distortion and quantization artifacts. The addition of dither to a signal prior to truncation is described more fully in U.S. Pat. No. 6,356,872 to Leung et al., which is incorporated herein by this reference in its entirety.

A method of converting sampled data to another larger word size is to simply shift the bits toward higher place values and fill in or pad the lower bits. The lower bits may be filled with zero bits or one bits. In some cases dither may be added to the lower bits of a lengthened sample word as disclosed in U.S. Pat. No. 6,356,872.

Previously, truncation and/or padding and the addition of dither is often done programmatically using a processor such as a DSP or microprocessor. This method required the presence of a suitably programmed processor to perform the conversion. The specific program needed depended on the difference in the word sizes, so that changes in the word length that a device used required changes in the software. Alternatively, custom hardware may be used to convert sample word length. However, such hardware would need to be redesigned if the word length of any underlying components were changed.

Methods and apparatuses for automatically converting sample word size when transmitting sample data from one device to another are desirable.

Automatically providing a correct amount of dither when converting sample data from one word length to another word length is also desirable.

SUMMARY OF INVENTION

The present invention provides a way of automatically determining a word length of sample data being transmitted over a serial link. The system includes a serial interface for transmitting or receiving one or more data words having digital signals, wherein the serial interface receives a bit clock for synchronizing transmission of individual bits and a word clock for grouping the bits into sample data words. Circuitry measures a desired word length by determining a relationship between the bit clock and the word clock that occur during the transmission or reception of a data word. Based on the desired word length, the sample words are truncated or padded, and an appropriate amount of dither is added to reduce the distortion and quantization artifacts introduced by the word length conversion. In a first embodiment of the invention, the circuitry is included in the serial interface of a device transmitting sample data to another device. In a second embodiment of the present invention, the circuitry for converting sample word length is included in devices receiving sample data from another device. In a third embodiment of the present invention, the circuitry for converting sample word length is included in a device that receives data from a first device transmitted at one word length and sends the data to another device at a different word length.

BRIEF DESCRIPTION OF DRAWINGS

For a more complete understanding of the present invention, and the advantages thereof, reference is now made to the following descriptions taken in conjunction with the accompanying drawings, in which.

DETAILED DESCRIPTION OF THE INVENTION

The principles of the present invention and their advantages are best understood by referring to the illustrated embodiment depicted in FIGS. 1-6 of the drawings, in which like numbers designate like parts.

Figure 1:
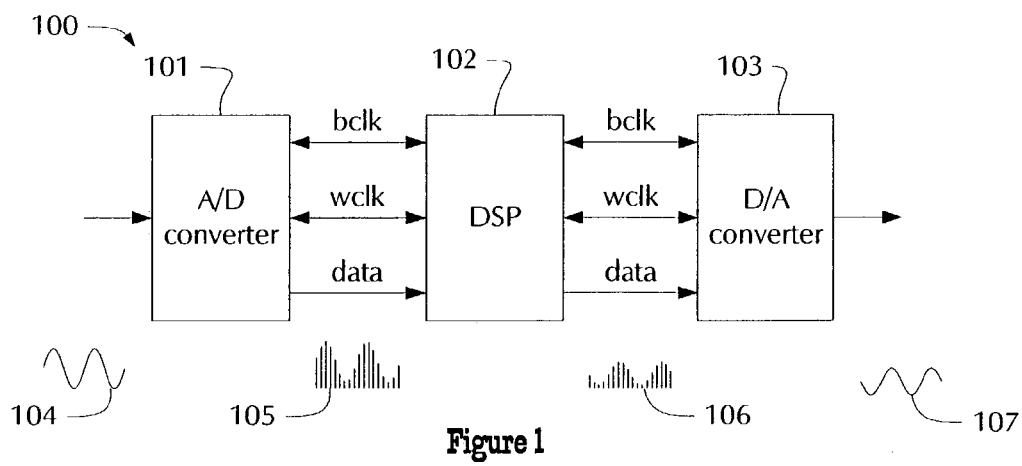
FIG. 1 is a schematic representation of a typical digital signal processing system.

A generic system for processing digital signals is shown in FIG. 1, wherein signal processing circuitry 100 includes analog-to-digital converter (ADC) 101, digital signal processor (DSP) 102, and digital-to-analog converter (DAC) 103. ADC 101 samples analog signal 104 to create a digital sample representing the value of analog signal 104 at a particular instant. By sampling analog signal 104 at regular intervals digital signal 105 is created. The digital samples of digital signal 105 are sent to DSP 102 for processing, after which processed digital signal 106 is sent to DAC 103. DAC 103 converts the digital signal back into analog signal 107.

In a typical application, ADC 101 has multiple analog inputs and samples multiple analog signals. For instance in a system for digitally processing stereo audio signals, ADC 101 samples both the left channel and right channel audio signals. High channel count systems may include six or more channels of audio information, in which, ADC 101 may provide digital signals for many audio channels.

Figure 2:
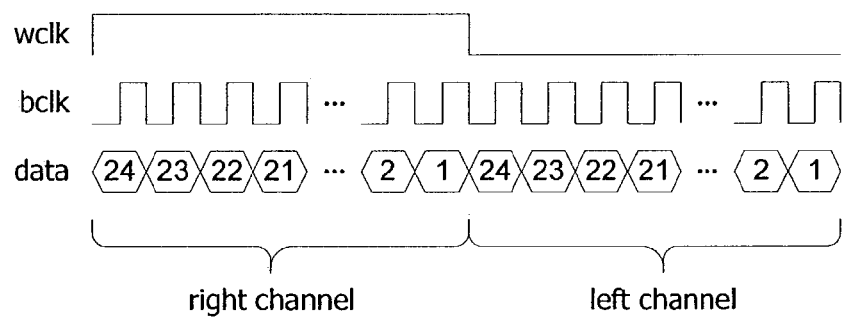
FIG. 2 is a timing diagram for an illustrative serial data format.

The digital samples are typically sent between ADC 101, DSP 102, and DAC 103 using a serial transmission scheme, such as the scheme shown in the illustrative timing diagram of FIG. 2. Data to be sent are placed on the data line in bit-serial fashion by the device sending the data. A bit clock (BCLK) signals when the data line has valid data, and a word clock (WCLK) identifies the beginning of a digital sample. For example, in the timing diagram of FIG. 2, the data line is changing on the falling edge of BCLK and has valid data on the rising edge of BCLK. Furthermore, the value of WCLK differentiates the right and left channels of data, and the edges of WCLK denote the first bit of a sample word. The communicating devices may be configured so that the sending device provides the bit clock and word clock or may be configured so that the clocks are provided by the receiving device. When multiple digital signals are being communicated, digital samples from the multiple digital signals are interleaved, and the word clock serves to differentiate at least one of the digital samples so that the sending and receiving devices are able to keep track of the multiple digital signals.

As described in the background of the invention, a device send a digital signal and a device receive the digital signal may have different word lengths. For example, ADC 101 may sample analog signal 104 and produce 24-bit digital samples, whereas DSP 102 may be designed to process 16-bit digital samples. The simplest method to convert digital samples from a longer word length to a shorter word length is to truncate the least significant bits of the longer data word. For instance, 24-bit data may be converted to 16-bit data by simply discarding the lower eight bits of data and only using the upper sixteen bits of data. However, such truncation often introduces objectionable distortions and noise into the signal. As described in U.S. Pat. No. 6,356,872, adding random noise or dither to the digital samples prior to truncation reduces the severity of the truncation artifacts. The amount of dither to add to a signal depends on the number of bits to be truncated from a sample word.

Figure 3:
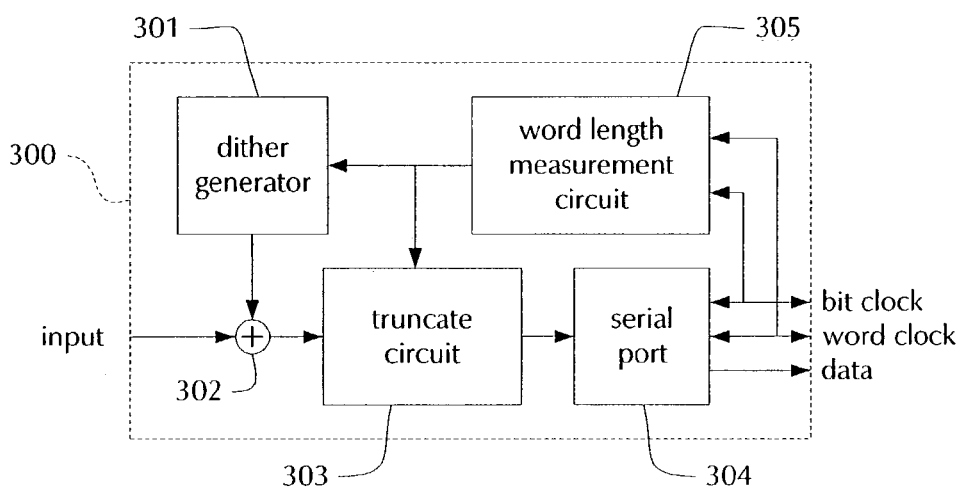
FIG. 3 is a simplified block diagram of exemplary circuitry for automatically converting the word length of data samples in accordance with the principles of the present invention.

FIG. 3 is an illustrative embodiment of automatic word length conversion circuitry 300 for use in a sending device in accordance with the principles of the present invention. Word length conversion circuit 300 receives input data ("input") having a certain word length, e.g., 24-bits. Dither generator 301 provides a small noise signal that is added to the input samples by addition circuit 302. The sum of the input samples and dither are then truncated by truncate circuit 303 before being transmitted by serial port 304. In one embodiment of the circuitry 300 of FIG. 3, truncate circuit 303 is a bit-shifting circuit that shifts the bits of the dithered samples so that the least significant bits are discarded.

In another embodiment, truncation is performed by serial port 304 by not transmitting the unneeded bits. When serial port 304 is configured to send the least significant bit first, truncation is accomplished by skipping the truncated bits and only sending the significant data bits. For example, to truncate 24-bit data to 16-bit data, serial port 304 skips the lowest eight bits and starts by transmitting the ninth bit. Conversely, when configured to send the most significant bit first, serial port 304 stops transmitting a data word as soon as the desired number of bits have been sent.

A relationship typically exists between BCLK and WCLK that may be used to determine the preferred word length of the digital samples. Word length measurement circuit 305 uses the relationship between BCLK and WCLK to determine the word length of the data to be transmitted. In the exemplary timing diagram of FIG. 2 the sample word length equals the number of BCLK cycles between two WCLK edges. In a device using the serial data format of FIG. 2, word length measurement circuit 305 determines the desired word length by counting the number of cycles of BCLK between a rising edge and falling edge of WCLK. In alternative embodiments of the invention, the method of determining the word length depends on the specific relationship between BCLK and WCLK and differs for different serial data formats.

Word length measurement circuit 305 provides an indication of the desired word length to dither generator 301. This information is used to select an appropriate amount of dither to add to the input signal.

Figure 4:
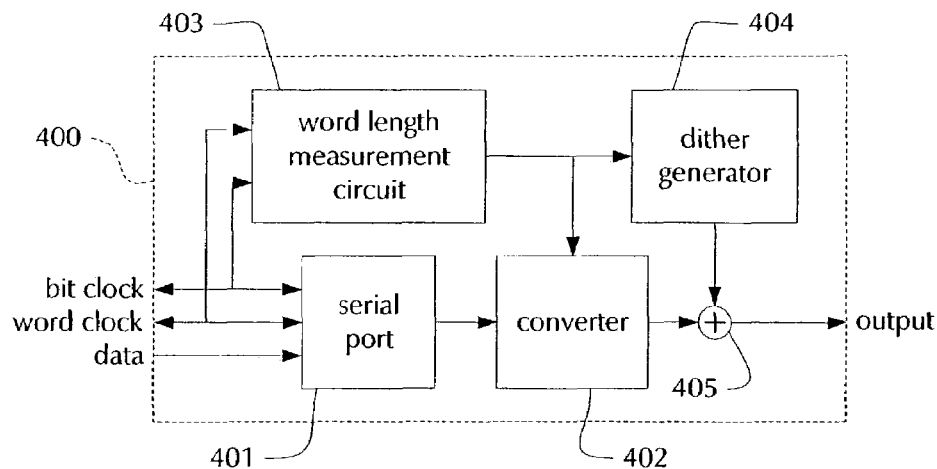
FIG. 4 is a simplified block diagram of an alternative embodiment of circuitry for converting the word length of data samples.

Referring now to FIG. 4, an alternative illustrative embodiment of the present invention is shown for use in a device receiving digital sample data of one word length and converting the sample data to a new longer word length. Automatic word length conversion circuitry 400 includes serial port 401 which receives data transmitted in a bit-wise serial format from another device. The received sample data is then converted to a new longer word length by converter 402. Word length measurement circuit 403 determines the word length of the digital samples being received by analyzing the bit clock and word clock as described above in connection with FIG. 3. The word length is supplied to dither generator 404, which supplies an appropriate amount of dither to be added to the converted sample data by addition circuit 405.

FIG. 3 shows automatic word length conversion circuitry for decreasing the word size in a device sending a serial bit stream of sample data, and FIG. 4 shows circuitry for increasing the word size in a device receiving a serial bit stream of sample data.

Figure 5:
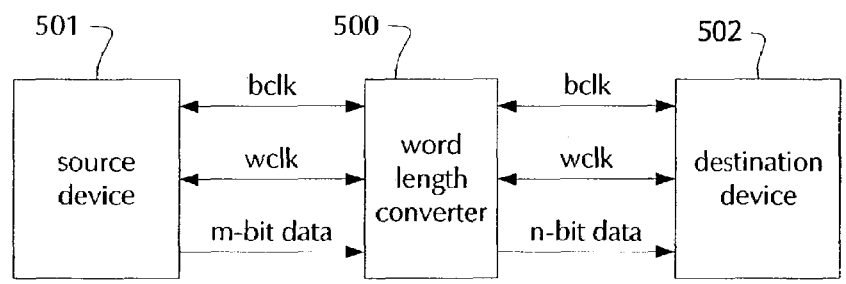
FIG. 5 is a simplified block diagram of a system in which to use the present invention.

It should be apparent that these configurations can be reversed so that a sending device increases the word length and a receiving device decreased the received word length. FIG. 5 shows a simplified block diagram of yet another embodiment of an automatic word length converter in accordance with the principles of the present invention. In contrast to the circuits of FIGS. 3 and 4, automatic word length converter circuitry 500 is designed to be connected between two devices as shown in FIG. 5.

In FIG. 5, source device 501 sends sample data having an word length of m bits. Destination device 502 is configured to receive sample data having a word length of n bits, wherein m#n. Automatic word length conversion circuitry 500 is placed between source device 501 and destination device 502 and automatically converts the sample data words from m bits to n bits in length.

Figure 6:
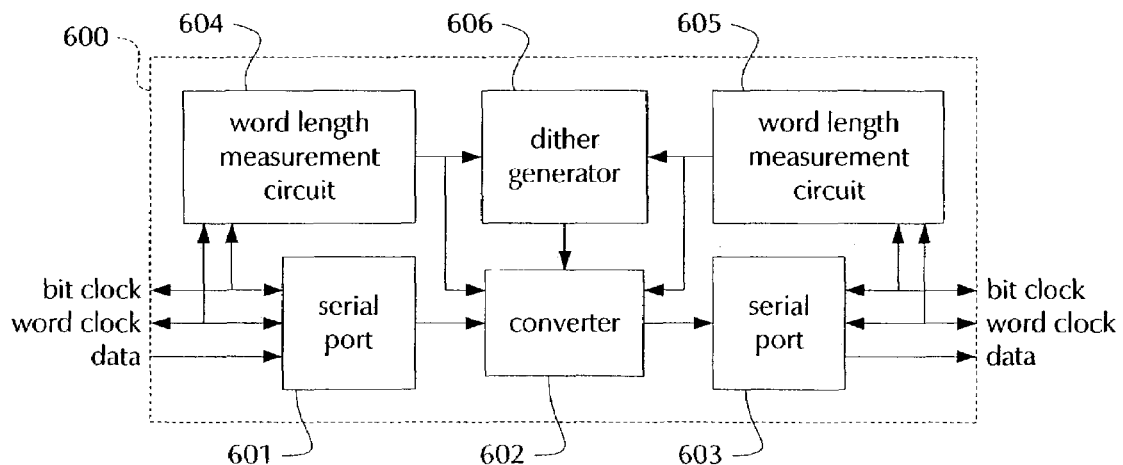
FIG. 6 is a simplified block diagram of another alternative embodiment of word length conversion circuitry in accordance with the principles of the present invention.

Referring to FIG. 6, automatic word length conversion circuitry 600 includes serial port 601, which receives sample data having a word length of m bits and serial port 603, which sends sample data having a word length of n bits. Word length measurement circuits 604 and 605 determine the word lengths, respectively, of the sample data received by serial port 601 and sent by serial port 603. Converter 602 uses the measured word lengths to determine whether to truncate or pad the received data words. For example, if received word length m is less than sent word length n, converter 602 pads the received words with n−m bits. Similarly, if received word length m is greater that sent word length n, converter 602 truncates m−n bits from the received data words. Dither generator 606 uses the measured word lengths to determine an appropriate amount of dither to add to the data samples to reduce the effects of the word length conversion. For instance, the dither is added to the data words either before truncation or after padding to the new word length.

Although the invention has been described with reference to a specific embodiments, these descriptions are not meant to be construed in a limiting sense. Various modifications of the disclosed embodiments, as well as alternative embodiments of the invention, will become apparent to persons skilled in the art upon reference to the description of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

It is therefore contemplated that the claims will cover any such modifications or embodiments that fall within the true scope of the invention.

What is claimed is:

1. Apparatus for automatically converting a length of data words transmitted as a serial bit stream on a data line, wherein a bit clock signal identifies individual bits in the bit stream and a word clock signal identifies groups of bits in the bitstream comprising data words, the apparatus comprising:
   a serial port coupled to the data line, the bit clock signal, and the word clock signal for communicating with another device;
   word length measuring circuitry that receives the bit clock signal and the word clock signal through the serial port and in response determines a word length of the data words being transmitted through the serial port;
   dither generation circuitry that generates dither responsive to the determined word length; and
   conversion circuitry that converts the transmitted data words to the determined word length by truncating the transmitted data words responsive to a difference between the determined word length and a desired word length and applies the generated dither.

2. Apparatus of claim 1, wherein the word length measuring circuitry comprises circuitry for measuring the word length of received data words; the apparatus further comprising:
   a second serial port for receiving data words from another device; and
   a second word length measuring circuitry for measuring a word length of the received data words;
   wherein the dither generation circuitry generates dither responsive to measured word lengths of both the received and transmitted data words.

3. Apparatus of claim 2, wherein the conversion circuitry pads the received data words if the received data word length is less than the transmitted word length and truncates the received data words if the received data word length is greater than the transmitted word length.

4. Apparatus of claim 3, wherein the dither is applied to the received word length either before the received word is truncated or after the received data word is padded to the transmitted word length.

5. Apparatus of claim 1, wherein the word length measuring circuitry determines a word length of the data words responsive to a predetermined relationship between the bit clock signal and the word clock signal.

6. A method for automatically converting a length of data words transmitted as a serial bit stream on a data line, wherein a bit clock signal identifies individual bits in the bit stream and a word clock signal identifies groups of bits in the bit stream comprising data words, the method comprising:
   communicating through a serial port coupled to the data line, the bit clock signal, and the word clock signal with another device;
   determining with word length measuring circuitry that receives the bit clock signal and the word clock signal a word length of the data words transmitted through the serial port;
   generating dither with dither generation circuitry responsive to the determined word length; and
   converting with conversion circuitry the data words to the determined word length by truncating the data words responsive to a difference between the determined word length and a desired word length and applying the generated dither.

7. The method of claim 6, wherein measuring the word length of the data words comprises measuring the word length of received data words received through a second serial port and the method further comprising:
   transmitting the received data words to the another device; and
   measuring a word length of the transmitted data words;
   wherein converting the received data words comprises padding the received data words if the received data word length is less than the transmitted word length or truncating the received data words if the received data word length is greater than the transmitted word length.

8. The method of claim 7, wherein generating dither comprises generating dither responsive to the measured word lengths of both the received and transmitted data words.

9. The method of claim 8, wherein the dither is applied to the received word length either before the truncating of the received data word or after the padding of the received data word.

10. The method of claim 6, wherein measuring the word length comprises determining a relationship between the bit clock signal and the word clock signals.

11. Apparatus for automatically converting a length of data words transmitted as a serial bit stream on a data line, wherein a bit clock signal identifies individual bits in the bit stream and a word clock signal identifies groups of bits in the bitstream comprising data words, the apparatus comprising:
- a serial port coupled to the data line, the bit clock signal, and the word clock signal for communicating with another device;
- word length measuring circuitry that receives the bit clock signal and the word clock signal through the serial port and in response determines a word length of the data words being transmitted through the serial port;
- dither generation circuitry that generates dither responsive to the determined word length; and
- conversion circuitry that converts the transmitted data words to the determined word length and applies the generated dither;
- wherein the word length measuring circuitry comprises circuitry for measuring the word length of received data words; the apparatus further comprises:
- a second serial port for receiving data words from another device; and
- a second word length measuring circuitry for measuring a word length of the received data words;
- wherein the dither generation circuitry generates dither responsive to measured word lengths of both the received and transmitted data words.

12. A method for automatically converting a length of data words transmitted as a serial bit stream on a data line, wherein a bit clock signal identifies individual bits in the bit stream and a word clock identifies groups of bits in the bit stream comprising data words, the method comprising:
- communicating through a serial port coupled to the data line, the bit clock, and the word clock with another device;
- determining with word length measuring circuitry that receives the bit clock signal and the word clock signal a word length of the data words transmitted through the serial port;
- generating dither with dither generation circuitry responsive to the determined word length; and
- converting with conversion circuitry the data words to the determined word length and applying the generated dither;
- wherein measuring the word length of the data words comprises measuring the word length of received data words received through a second serial port and the method further comprises:
- transmitting the received data words to the another device; and
- measuring a word length of the transmitted data words;
- wherein converting the received data words comprises padding the received data words if the received data word length is less than the transmitted word length or truncating the received data words if the received data word length is greater than the transmitted word length.

* * * * *